United States Patent
Farassat

(10) Patent No.: US 7,156,602 B2
(45) Date of Patent: Jan. 2, 2007

(54) MECHANISM FOR EXCHANGING CHIP-CARRIER PLATES FOR USE IN A HYBRID CHIP-BONDING MACHINE

(75) Inventor: Farhad Farassat, Taufkirchen (DE)

(73) Assignee: F & K Delvotec Bondtechnick GmbH, Ottobrunn (DE)

( * ) Notice: Subject to any disclaimer, the term of this patent is extended or adjusted under 35 U.S.C. 154(b) by 0 days.

(21) Appl. No.: 10/081,028

(22) Filed: Feb. 21, 2002

(65) Prior Publication Data

US 2003/0086775 A1    May 8, 2003

(30) Foreign Application Priority Data

Nov. 8, 2001    (EP)    ................................. 01126708

(51) Int. Cl.
*B25J 9/00* (2006.01)
(52) U.S. Cl. ............................. 414/331.18; 414/751.1; 414/941
(58) Field of Classification Search ........... 414/331.14, 414/331.18, 416.03, 416.08, 937, 941, 751.1
See application file for complete search history.

(56) References Cited

U.S. PATENT DOCUMENTS

| | | | | |
|---|---|---|---|---|
| 3,494,482 A | | 2/1970 | Lense | |
| 4,775,281 A | * | 10/1988 | Prentakis | 414/416.03 |
| 5,183,370 A | * | 2/1993 | Cruz | 414/416.03 |
| 5,203,659 A | * | 4/1993 | Schweitzer et al. | 414/225.01 |
| 5,364,222 A | * | 11/1994 | Akimoto et al. | 414/416.03 |
| 5,498,118 A | * | 3/1996 | Nakahara | 414/416.03 |
| 5,626,456 A | * | 5/1997 | Nishi | 414/404 |
| 5,697,748 A | * | 12/1997 | Somekh et al. | 414/217 |
| 5,989,346 A | * | 11/1999 | Hiroki | 118/719 |

FOREIGN PATENT DOCUMENTS

| | | |
|---|---|---|
| EP | 0 447 082 B1 | 4/1991 |
| EP | 0 447 083 A1 | 4/1991 |
| EP | 0 447 087 A1 | 4/1991 |
| EP | 1 057 388 B1 | 2/1999 |
| JP | 20569544 | 2/1990 |

* cited by examiner

*Primary Examiner*—Dean J. Kramer
(74) *Attorney, Agent, or Firm*—Knobbe, Martens, Olson & Bear, LLP

(57) ABSTRACT

A mechanism for exchanging chip-carrier plates in a hybrid chip-bonding machine having a plurality of chip-carrier plates, a magazine to store the plurality of chip-carrier plates, and a transport arrangement having a first and second clamping device that are disposed on a movable holder is disclosed. The transport arrangement is designed to remove a selected chip-carrier plate from the magazine and deliver it to a chip processing station. After processing, the selected chip-carrier plate is removed and deposited in the magazine. Movement of the chip-carrier plates is controlled such that the selected chip-carrier plate is positioned at a collection point to be collected from the magazine. Movement of the transport arrangement holder is controlled such that the first and second clamping devices are disposed in a vertical arrangement on the holder and are constructed to individually release or grip a chip-carrier plate in a similar angular position of the holder.

30 Claims, 3 Drawing Sheets

MECHANISM FOR EXCHANGING CHIP-CARRIER PLATES FOR USE IN A HYBRID CHIP-BONDING MACHINE

RELATED APPLICATIONS

This application claims the benefit of the European application 01 126 708.5 filed Nov. 8, 2001.

BACKGROUND OF THE INVENTION

1. Field of the Invention

The invention relates to a mechanism for exchanging chip-carrier plates in a hybrid chip-bonding machine, in particular to an automatic hybrid chip-bonding machine.

2. Description of the Related Art

A hybrid chip-bonding machine is used to bond semiconductor chips of various types, and in particular of different sizes, to a substrate. In the delivery stage chips are transported individually to a system that detaches the chips and sends them to a suitable receiving tool. A variety of chip-delivery systems are known and in use, and the choice of such a system is determined primarily by the size of the chip. The available chip-delivery systems include, for example, wafer rings or carrier-film frames and waffle packs, also called gel packs, each of which can be obtained in various sizes.

For automatic hybrid chip bonding the machine must be capable of handling a number of different sizes or types of chips while requiring the shortest possible time for changing from one size or type of chip to another, so that the machine running time is interrupted only briefly.

Each individual wafer, each carrier-film frame or each waffle pack or gel pack in any of the known chip-transporting systems contains chips of only a single type or size. If during the bonding process it becomes necessary to change from one type or size of chip to another, it is also necessary to change to another chip-carrier plate, even though the carrier plate may be of the same type, and the only difference resides in the chips that are being delivered. In known hybrid chip-bonding machines the chip-carrier plates are exchanged individually, which lengthens the production time.

The applicant's patent EP 0 447 082 B 1 discloses a mechanism for exchanging chip-carrier plates that is designed for use in a hybrid chip-bonding machine, in particular an automatic hybrid chip-bonding machine. In this case an automatic hybrid chip-bonder comprises a chip-carrier-plate system, a station for detaching the chips, and a system for receiving and mounting the chips, which may consist of a die collet system or an epoxy die bonder.

The chip-detaching system according to the applicant's patent EP-A-0 447 083 comprises a carrier, a plurality of chip-detaching heads mounted on the carrier, and a device for the stepwise advancement of the carrier so as to move a head incrementally into an operating position. The various heads bear chip-detaching pins in different arrangements, each one suitable for detaching a particular size or type of chip. After it has been detached, the chip is taken up by a suitable receiving means and transported to a chip assembly station.

The chip-receiving stage advantageously comprises a system for exchanging tools such as is described in the applicant's patent EP-A-0 447 087. This includes a set of tools with a plurality of tool holders, into each of which a tool is inserted and which are configured so as to be received by a head. The head is mounted on a holder and can be driven between the set of tools, the chip-detaching system and a chip-assembly station. The set of tools can be driven in such a way as to pass a selected tool holder on to a station at which it can be taken up by the head.

The system for exchanging chip-carrier plates according to the above-mentioned EP 0 447 082 B1 comprises:
(a) a magazine to store a plurality of chip-carrier plates,
(b) a transport arrangement attached to an axial peg that can be rotated about its vertical axis and incorporates a first and a second clamping device, which are attached to a rotatable holder, such that each clamping device is designed to collect a selected chip-carrier plate from the magazine, guide it to a chip-detaching system of the chip-bonding machine, remove it from the chip-detaching system after a predetermined number of chips have been detached, and return it to the magazine,
(c) a switching means to shift the carrier plates within the magazine, so that the selected carrier plate is positioned at a collection point for collection from the magazine, and
(d) a switching means to rotate the transport arrangement further about the above-mentioned vertical axis.

SUMMARY OF THE INVENTION

It is the objective of the present invention to disclose an improved mechanism for exchanging chip-carrier plates as well as a method of operating such a mechanism, with which still greater operating efficiency can be attained, and hence lower production costs for chip bonding.

This objective is achieved with respect to the apparatus by a chip-carrier-late exchange mechanism of the present invention.

The invention includes the fundamental idea of further shortening the time required for transport between the magazine, which contains the chip-carrier plates provided for the production process, and the chip-detaching system, by a combination of delivery and removal process.

The invention also includes the idea of modifying the construction of the chip-carrier-plate exchange mechanism for this purpose. Finally, the invention likewise includes the idea of making this modification at the transport arrangement, specifically with respect to the arrangement of the clamping devices disposed there. As a result of this modification, namely arranging the clamping devices one above another in combination with making them capable of being separately controlled or actuated, the above-mentioned combined delivery and removal process is achieved in a simple manner.

With the proposed arrangement, together with suitable control of the transport arrangement, when the transport arrangement is in a first operating position next to the magazine it is possible almost simultaneously to remove from the magazine a first chip-carrier plate needed for processing and to deposit in the magazine a chip-carrier plate that has been removed from the processing station. Likewise, when the transport arrangement is in a second operating position next to the chip-detaching system, the proposed arrangement also enables the removal of a chip-carrier plate that is to be transported away to be followed immediately by the transfer into the processing station of a chip-carrier plate containing the chips to be processed.

In a preferred embodiment of the transport arrangement, the first and second clamping devices each comprise a chip-receiving element that can be moved between a first and a second position at different distances from a basic position of the holder. Each receiving element is provided with a clamp for controllably gripping or releasing one chip-carrier plate. The clamps are preferably actuated pneumatically or electrically, so that the transport arrangement can be easily and rapidly moved and controlled and can have a compact structure.

The chip-carrier plates have in particular substantially the shape of a square plate with an opening in the interior. Between the outer edges of the plate and this opening specially shaped recesses are provided, which serve as receptacles for wafers as well as various standardized carriers for multiple individual chips.

The receiving elements of the transport arrangement are adapted to the shape and dimensions of a corner region of the chip-carrier plate and have two limbs oriented perpendicular to one another and connected to one another by a front edge shaped like a quarter-circle. This front edge is concentric with a chip-carrier plate that rests on the receiving element. The clamps of the receiving element are near the outer edges of the two limbs and cooperate with catch means (special cut-outs) on the surface of the chip-carrier plate. As a result, precise positioning of the chip-carrier plate with respect to the transport arrangement is ensured, which in turn ensures that the transfer into the processing station or into the magazine will be extremely precise. Preferably in two other corner regions of the chip-carrier plate additional catch means are provided to engage receiving elements at the chip-detaching system.

In the preferred embodiment of the exchanging mechanism the first and second clamping devices are attached to a common base element, which can be displaced vertically (within a limited range) with respect to the holder of the transport arrangement. As a result—in combination with a corresponding design of the magazine itself—the proposed deposition and removal processes are correctly executed on the magazine side, as are the transfer and reception of chip-carrier plates at the chip-detaching system.

BRIEF DESCRIPTION OF THE DRAWINGS

A preferred embodiment of a chip-carrier-plate system in accordance with the invention is described in greater detail in the following, with reference to the attached drawings, wherein.

DETAILED DESCRIPTION OF THE PREFERRED EMBODIMENT

Figure 1:
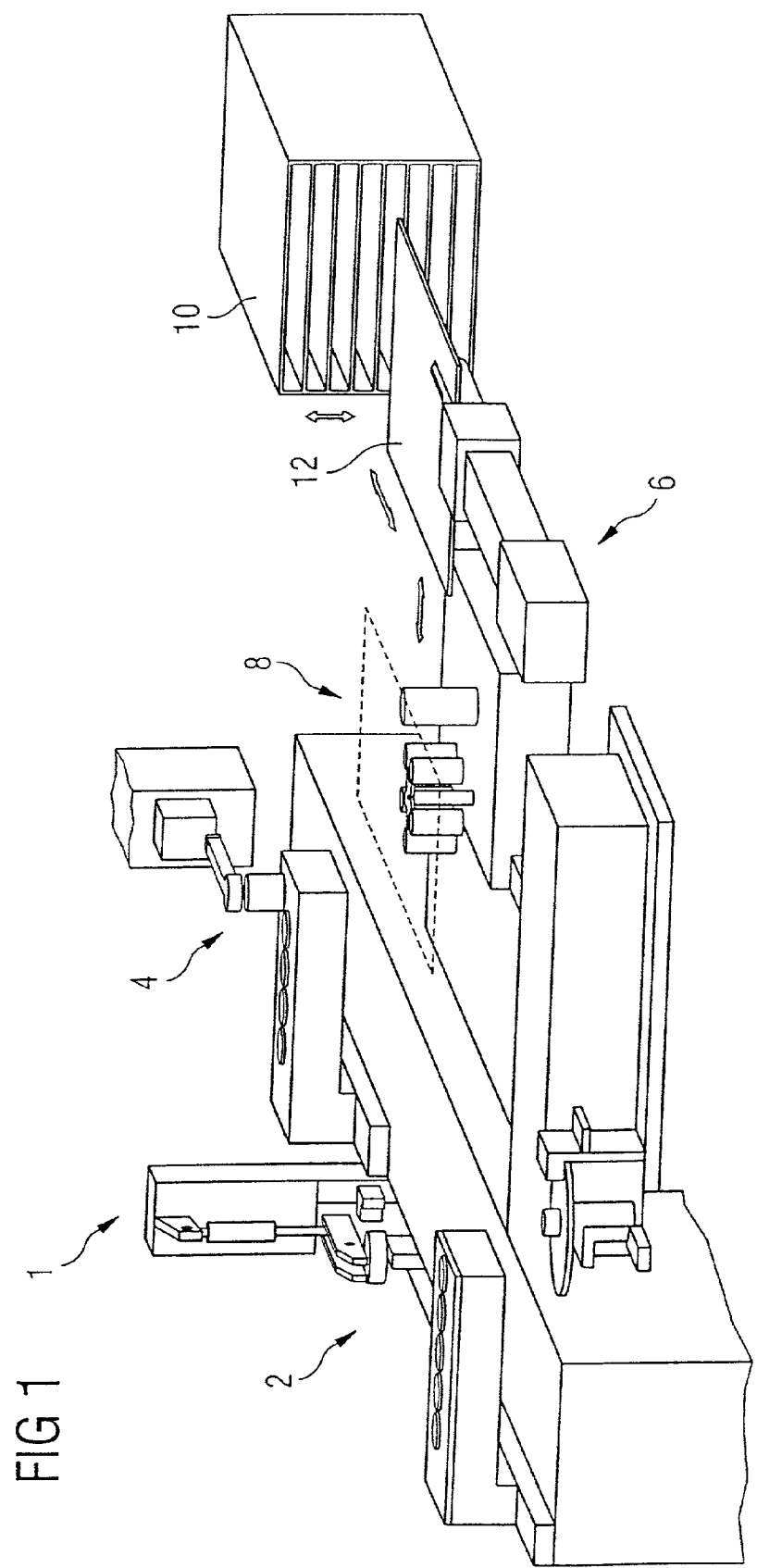
FIG. 1 shows a schematic overall view of the components of an automatic hybrid chip-bonding machine.

FIG. 1 shows the principles of construction of an automatic hybrid chip-bonding machine 1, which comprises on one hand an epoxy die bonder 2 and on the other hand a die collet system 4 for chip assembly, which are the actual processing stations. The chip-bonding machine 1 further comprises a chip-delivery system 6 and a chip-detaching system 8. The chip-delivery system 6 includes a magazine 10 to contain a plurality of chip-carrier plates as well as the actual delivery mechanism, which is the object of the invention. Chip-bonding machines of this kind have long been known, so that their construction and the interaction of the main components need not be described further here.

A magazine 10 can contain five or more chip-carrier plates 12. It has a frame with ridges to support the chip-carrier plates when they are pushed in, and can be shifted vertically so that selected carrier plates are brought into a removal position, and empty slots brought into a receiving position for the insertion of carrier plates that have been transported back.

Figure 2:
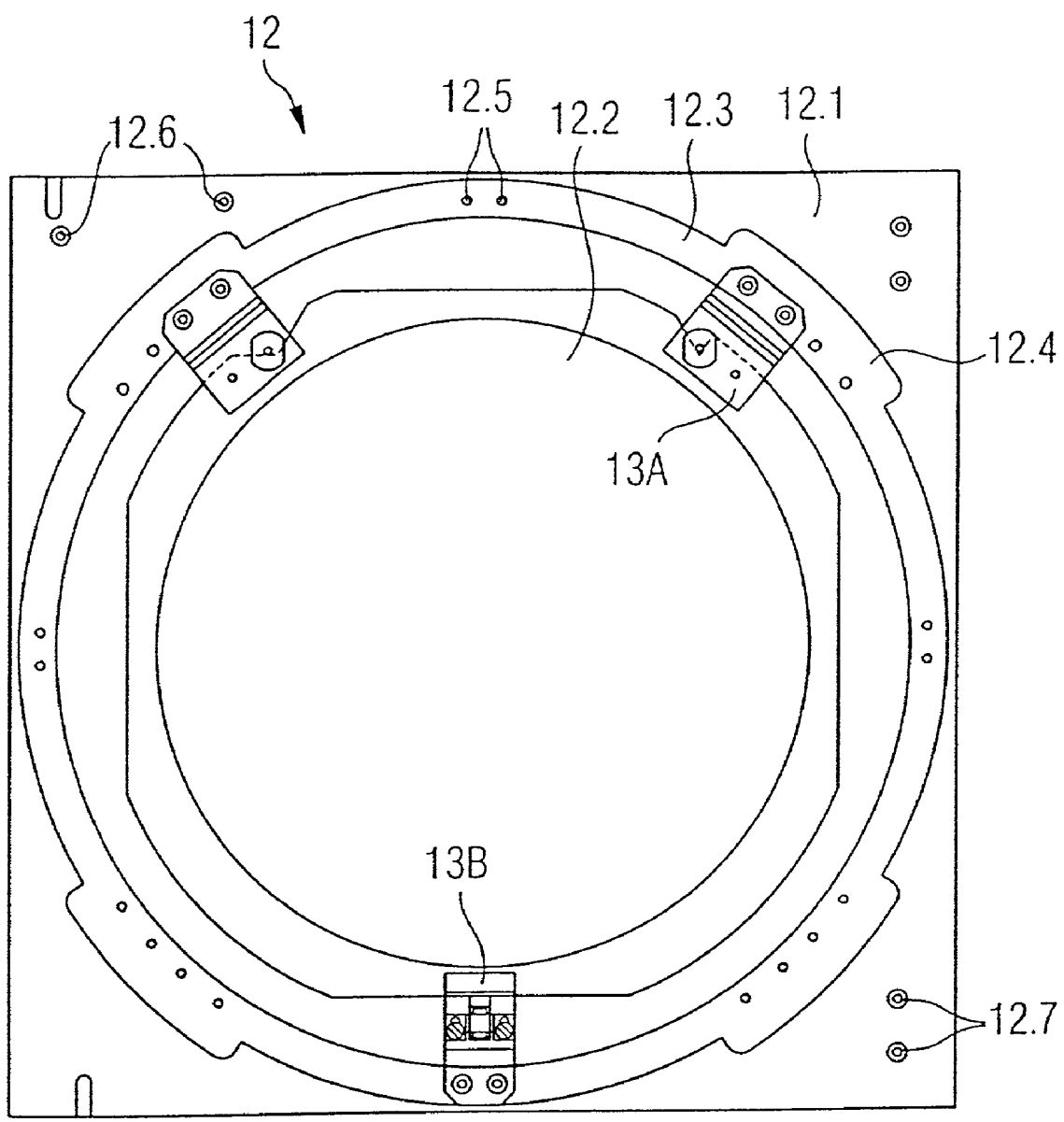
FIG. 2 shows a plan view of a chip-carrier plate.
Figure 3A:
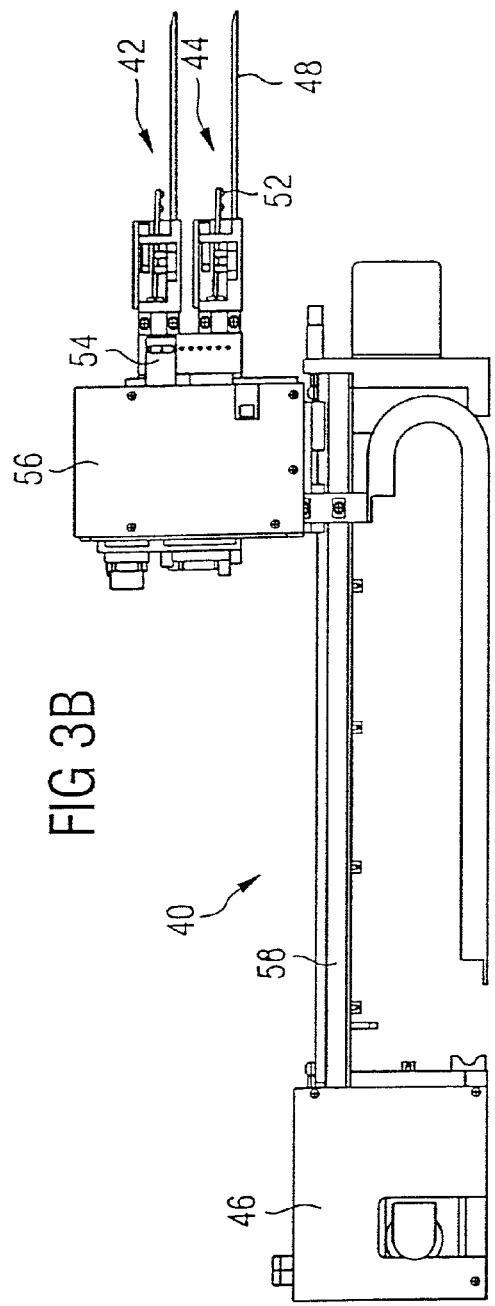
FIGS. 3A to 3C show three views of a rotatable and linearly movable transport arrangement.
Figure 3B:
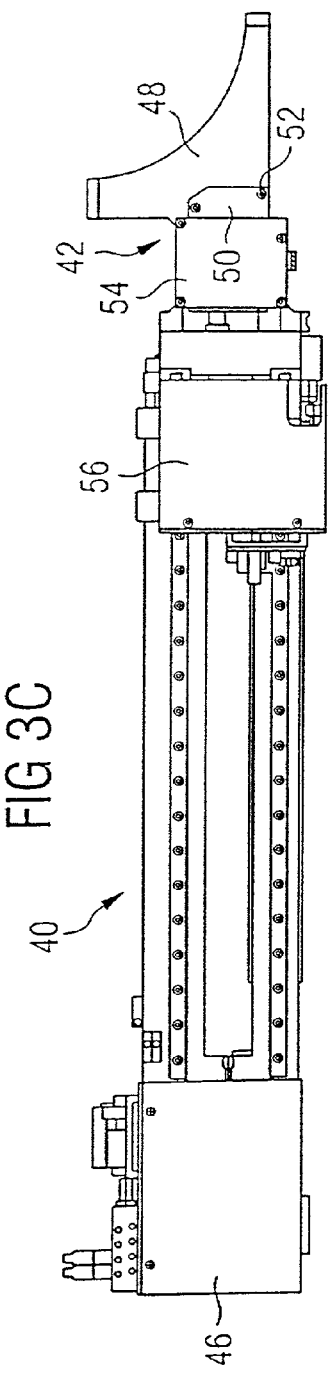
Figure 3C:
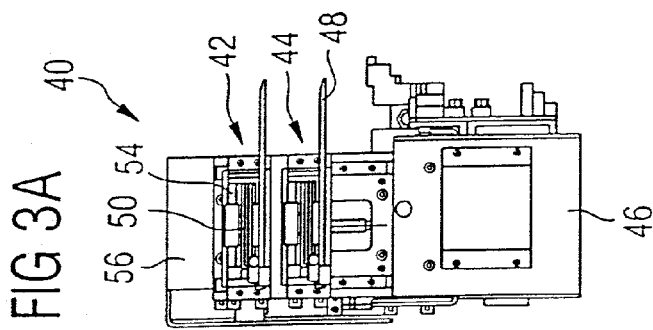

FIG. 2 shows a plan view of a preferred chip-carrier plate 12 for use in a hybrid chip-bonding machine 1 according to FIG. 1, in combination with a transport arrangement 40 according to FIGS. 3A to 3C.

FIGS. 3A to 3C show a front view, a side view and a plan view, respectively, of a transport arrangement 40 as the central component of the chip-delivery system 6 of a hybrid chip-bonding machine according to FIG. 1. This unit comprises a first and a second clamping device 42, 44, which are disposed one above the other on a base element (head) 46.

Each of the first and second clamping devices 42, 44 comprises a receiving element 48, above which a clamp piece 50 is disposed. Each clamp piece 50 comprises two centring cones 52, which interact with corresponding recesses in the chip-carrier plate 12 (see FIG. 2). The receiving means 48 and the clamp piece 50 are held in the open position by a spring (not shown).

The spring force is overcome by a pneumatically operating drive means (not shown), which moves the relevant clamp piece 50 with the centring cones 52 disposed thereon towards the associated receiving element 48. As a result, the chip-carrier plate that is to be gripped is clamped between the two structures and simultaneously fixed precisely in the desired position.

Both clamping devices 42, 44 are mounted on a sliding piece 54, which is seated in a clamp housing 56 so that it can be vertically displaced. The vertical adjustability of the sliding piece 54, within a predetermined displacement range, facilitates the transfer to its receiving-element of a carrier plate that is to be delivered to the chip-detaching system, as well as the transfer of a carrier plate that has already been processed from the receiving element of the chip-detaching system, in particular in two consecutive steps of the operation. Projecting from the base element 46 is an extension arm 58, on which the clamp housing 56 and with it the clamping devices 42, 44 are seated so that they can move longitudinally.

In a suitable control combination to drive the clamp housing 56 along the extension arm 58, as well as to move the sliding piece 54 with respect to the clamp housing 50 and the clamp pieces 50 with respect to the receiving elements 48, the reception and deposition of transported chip-carrier plates 12 are brought about at the magazine 10 as well as at the chip-detaching system 8. The transport between these is implemented substantially by the above-mentioned longitudinal movements of the clamp housing 56 along the extension arm 58, in combination with vertical movements of the magazine 10 to put a selected chip-carrier plate into the release position or an empty slot into the receiving position, as well as in combination with reception and displacement movements of at least one receiving element in the chip-detaching system (not described in more detail here).

The chip-carrier plate 12 has substantially the shape of a square plate 12.1 with a central circular aperture 12.2. The latter is surrounded by an annular groove 12.3 that is expanded in several regions 12.4 and has around its periphery a plurality of mounting bores 12.5, by way of which are mounted (in various possible positions) work-piece holders 13A or 13B, to hold wafers or additional carriers for a plurality of chips (not shown). Two pocket bores 12.6 in the surface of the plate 12.1 are provided to engage the correspondingly disposed centring cones 52 on the clamping devices 42, 44 of the clamping arrangement (FIGS. 3A to 3C), and two additional pairs of bores 12.7 are provided so that the carrier plate can be grasped by a receiving element of the chip-detaching system and precisely positioned there.

The chip-carrier plate shown here is only one of many advantageous embodiments, which are adapted to the various types of chips and chip-delivery systems mentioned at the outset. Hence it will be understood that in a particular mechanism for exchanging chip-carrier plates, the only invariant features are the external dimensions and the position and shape of clamping elements for transport of the chip-carrier plates.

In the sense of the sequence of transport events, described elsewhere and specified in the claims related to method, the transport arrangement 40 of the exchange mechanism 6 is in each case brought into a first working position, in which the clamping devices 42, 44 can each deposit a chip-carrier plate coming from the processing station, i.e., the chip-detaching system, in the magazine 10 and and can pick up from it a new chip-carrier plate; or it is brought into a second working position, in which the chip-carrier plate that was last put into the station is taken out of it and almost simultaneously the newly collected chip-carrier plate is put into the station.

In the magazine 10 the chip-carrier plate 12 is driven by a DC motor into the vertical position in which a selected chip-carrier plate 12 is at the correct vertical level to be delivered to the rotatable transport arrangement 40.

The relevant chip-carrier plate is gripped and taken out of the magazine, and thereafter by suitable displacement of the chip-carrier plates 12 in the magazine 10 as well as the sliding piece 54 with respect to the clamp housing 56 of the transport arrangement 40, the carrier plate that has just been brought back is released by the transport arrangement and deposited in a free slot in the magazine. The sequence of the two events can also be reversed. The unloading and loading procedure in the processing station, i.e. the chip-detaching system 8, cannot be discerned in the figures, but a person skilled in the art can deduce it from the structure of the transport arrangement and the explanation of the procedural sequence given above.

The described steps of removal, movement and deposition of the carrier plates are carried out under program control, in which a well-honed system of sensors reliably prevents the sending of false control signals—which might, for instance, cause a carrier plate that is being returned from the chip-detaching system to be placed in an already occupied slot in the magazine. Obviously, the selection of particular carrier plates from the magazine and the subsequent detachment of specific chips from the particular substrate (carrier film or the like) in the chip-detaching system are performed on the basis of a previously stored loading scheme.

By executing the working cycle described above, it is possible to operate the hybrid chip-bonder with a greatly reduced turn-off time between the bonding of different types of chip.

List of reference numerals

| | |
|---|---|
| 1 | Hybrid chip-bonding machine |
| 2 | Epoxy die bonder |
| 4 | Die collet system |
| 6 | Chip delivery system |
| 8 | Chip-detaching system |
| 10 | Magazine |
| 12 | Chip-carrier plate |
| 12.1 | Square plate |
| 12.2 | Central aperture |
| 12.3 | Groove |
| 12.4 | Expanded region |
| 12.5 | Mounting bore |
| 12.6, 12.7 | Bore (engagement means) |

-continued

List of reference numerals

| | |
|---|---|
| 13A; 13B | Work-piece holder |
| 40 | Transport arrangement |
| 42, 44 | Clamping device |
| 46 | Base element (head) |
| 48 | Receiving element |
| 50 | Clamp piece |
| 52 | Centring cone |
| 54 | Sliding piece |
| 56 | Clamp housing |
| 58 | Extension arm |

The invention claimed is:

1. A mechanism for exchanging chip-carrier plates for use in a hybrid chip-bonding machine having a chip-detaching system and a common base element, the mechanism comprising:
 a plurality of chip-carrier plates;
 a magazine having a plurality of slots to store the plurality of chip-carrier plates, wherein the magazine vertically moves the chip-carrier plates so that a selected chip-carrier plate can be positioned in a release position and an empty slot can be positioned in a receiving position;
 a transport arrangement having a first and a second clamping device that are disposed on a movable holder in a manner which is attached to a base via an extension arm such that the transport arrangement is designed to remove a selected chip-carrier plate from the magazine in a first angular orientation, deliver the selected chip-carrier plate to a processing station of the chip-detaching system, and after processing remove the selected chip-carrier plate from the processing station and deposit the selected chip-carrier plate in the magazine, wherein the transport mechanism substantially maintains the chip carrier plate in the first angular orientation throughout the whole transport process and wherein the first and second clamping devices are positioned in the transport arrangement so as to substantially simultaneously remove a new selected chip carrier plate from the magazine while depositing the selected chip carrier plate in the magazine and so as to substantially simultaneously remove a selected chip carrier plate from the processing station while depositing the selected chip corner plate in the magazine;
 a first controller configured to move the chip-carrier plates within the magazine in a manner such that the selected chip-carrier plate is positioned at a collection point to be collected from the magazine; and
 a second controller configured to move the movable holder of the transport arrangement, wherein the second controller allows for vertical movement of the first and second clamping devices in a predetermined displacement range and also one dimensional longitudinal movement in the direction of the extension arm of the first and second clamping devices along a predetermined displacement range wherein the first and second clamping devices are disposed one above the other in a vertical arrangement on the holder and are constructed so that each can individually release or grip a chip-carrier plate on one and the same angular position of the holder.

2. The mechanism of claim 1, wherein the first and second clamping devices comprise a receiving element with a pneumatically or electrically actuated clamp for the controllable fixation of a chip-carrier plate or the release thereof.

3. The mechanism of claim 1, wherein the chip-carrier plates are constructed as plates with a substantially square outer shape and engagement bores to engage the clamping devices of the transport arrangement as well as a holding device of the chip-detaching system.

4. The mechanism of claim 1, wherein the chip-carrier plates are designed to receive conventional chip carriers selected from the group consisting of a type of the waffle pack, gel pack, and carrier-film frame.

5. The mechanism of claim 1, wherein the first and second clamping devices are attached to a common base element that can be displaced vertically with respect to a housing of the transport arrangement.

6. A method of operating a mechanism for exchanging chip-carrier plates in a hybrid chip-bonding machine, wherein, when a transport arrangement of an exchanging mechanism is in a first working position, comprising the steps of:

vertically moving the chip carrier plates in a magazine such that a selected chip carrier plate is positioned in a release position and an empty slot is positioned in a receiving position;

removing a selected chip-carrier plate from the release position in a first angular orientation in the magazine by vertically moving a transport arrangement vertically and longitudinally along predetermined one dimensional displacement ranges defined by an extension arm while substantially simultaneously depositing another chip-carrier plate into the receiving position in the magazine, which has been taken out of a processing station, wherein the selected chip carrier plate and the another chip carrier plate are oriented in the magazine so as to be positioned one above the other to thereby facilitate substantially simultaneous removal and depositing in a magazine, and when the transport arrangement is in a second working position, transferring the chip-carrier plates taken from the magazine into the processing station while substantially maintaining the chip carrier plates in the first angular orientation, removing the processed chip-carrier plates from the processing station, such that each transport event from the magazine to the processing station and in the reverse direction is carried out while a chip-carrier plate is being handled in the processing station.

7. The method of claim 6, wherein delivering the selected chip-carrier plate to the processing station further includes the step of returning the selected chip-carrier plate from the processing station to the magazine.

8. The method of claim 6, wherein the transport arrangement moves only in a straight line in both directions between the first and second working positions.

9. The method of claim 6, wherein the steps are performed in the listed order.

10. The method of claim 6, wherein the steps are performed in the reverse of the listed order.

11. A mechanism for exchanging chip-carrier plates in a chip-bonding machine having a processing station, the mechanism comprising:

a magazine having a plurality of slots to store the chip-carrier plates, wherein the magazine vertically moves the chip carrier plates so that a selected chip carrier is positioned in a release position and an empty slot is positioned in a receiving position;

a transport arrangement having a first and second clamping device that are attached to a base via an extension arm wherein the first and second claming devices are disposed on a movable holder so as to be positioned one above the other in vertical alignment wherein the movable holder moves both vertically and longitudinally in a single dimension defined by the extension arm along predefined ranges such that the transport arrangement is designed to remove a selected chip-carrier plate from the magazine in a first angular orientation, deliver the selected chip-carrier plate to the processing station, and after processing remove the selected chip-carrier plate from the processing station and deposit the selected chip-carrier plate in the magazine in the receiving position while substantially maintaining the chip carrier plate in the first angular orientation throughout the transport process while substantially simultaneously removing another chip carrier plate from the release position; and a first control component that is configured to move the holder of the transport arrangement, wherein the first and second clamping devices are disposed one above the other on the holder and are configured in a manner such that each clamping device individually releases or grips at least one of the chip-carrier plates in a position relative to the holder.

12. The mechanism of claim 11, wherein the mechanism further comprises a second control component.

13. The mechanism of claim 12, wherein the second control component is configured to move the at least one of the chip-carrier plates within the magazine in a manner such that the selected chip-carrier plate is positioned at a collection point to be collected from the magazine.

14. The mechanism of claim 11, wherein the first and second clamping devices comprise a receiving element with an actuated clamp for the controllable fixation or release of at least on of the chip-carrier plates.

15. The mechanism of claim 14, wherein the actuated clamp is a pneumatically actuated clamp.

16. The mechanism of claim 14, wherein the actuated clamp is an electrically actuated clamp.

17. The mechanism of claim 11, wherein the chip-carrier plates are constructed as plates with a substantially square outer shape and engagement device.

18. The mechanism of claim 17, wherein the engagement device is used by the transport arrangement as a holding device.

19. The mechanism of claim 18, wherein the engagement device comprise bores, which are configured to engage the clamping devices of the transport arrangement.

20. The mechanism of claim 11, wherein the chip-carrier plates are designed to receive conventional chip carriers.

21. The mechanism of claim 20, wherein the conventional chip-carriers are carrier types selected from the group consisting of a waffle pack, a gel pack, and a carrier-film frame.

22. The mechanism of claim 11, wherein the mechanism further comprises a common base element and a transport arrangement housing.

23. The mechanism of claim 22, wherein the first and second clamping devices are attached to the common base element.

24. The mechanism of claim 23, wherein the common base element may be displaced vertically with respect to the transport arrangement housing.

25. The mechanism of claim 11, wherein the chip-bonding machine is a hybrid chip-bonding machine.

26. The mechanism of claim 11, wherein the mechanism further comprises a chip-detaching system.

27. The mechanism of claim 26, wherein the chip-detaching system comprises the processing station.

28. The mechanism of claim 11, wherein the first and second clamping devices are disposed one above the other in a vertical arrangement on the holder.

29. The mechanism of claim 11, wherein the first and second clamping devices are configured so that each clamping device individually releases or grips a chip-carrier plate in a substantially similar position relative to the holder.

30. The mechanism of claim 29, wherein the position includes an angular position.

* * * * *